United States Patent [19]
Marcus et al.

[11] Patent Number: 6,077,751
[45] Date of Patent: Jun. 20, 2000

[54] METHOD OF RAPID THERMAL PROCESSING (RTP) OF ION IMPLANTED SILICON

[75] Inventors: Steven D. Marcus, Tempe, Ariz.; Frederique Glowacki, Ulm; Barbara Froeschle, Dornstadt, both of Germany

[73] Assignee: Steag RTP Systems GmbH, Germany

[21] Appl. No.: 09/015,441

[22] Filed: Jan. 29, 1998

[51] Int. Cl.[7] .................. H01L 21/336; H01L 21/469; H01L 21/26; H01L 21/524

[52] U.S. Cl. ................ 438/308; 438/771; 438/788; 438/795

[58] Field of Search ................... 438/308, 771, 438/788, 795, 299; 257/174

[56] References Cited

U.S. PATENT DOCUMENTS

| | | | |
|---|---|---|---|
| 4,784,975 | 11/1988 | Hofmann et al. | 437/247 |
| 5,098,865 | 3/1992 | Machado et al. | |
| 5,164,331 | 11/1992 | Lin et al. | |
| 5,250,147 | 10/1993 | Mantl et al. | |
| 5,451,799 | 9/1995 | Kurimoto et al. | 257/174 |
| 5,462,898 | 10/1995 | Chen et al. | |
| 5,498,577 | 3/1996 | Fulford, Jr. et al. | |
| 5,648,282 | 7/1997 | Yoneda | |
| 5,766,969 | 6/1998 | Fulford, Jr. et al. | |
| 5,789,780 | 8/1998 | Fulford, Jr. et al. | 438/231 |
| 5,811,326 | 9/1998 | Yamamoto | 438/163 |
| 5,834,353 | 11/1998 | Wu | 438/287 |
| 5,837,588 | 11/1998 | Wu | 438/305 |
| 5,846,857 | 12/1998 | Ju | 438/199 |
| 5,880,508 | 3/1999 | Wu | 438/287 |
| 5,926,714 | 7/1999 | Gardner et al. | 438/303 |
| 5,935,650 | 8/1999 | Lerch et al. | 438/773 |
| 5,949,092 | 9/1999 | Kadosh et al. | 438/153 |
| 5,966,605 | 10/1999 | Ishida | 438/299 |
| 5,981,347 | 11/1999 | Kuo et al. | 438/308 |

OTHER PUBLICATIONS

S. R. Wilson, Transient annealing of ion implanted semiconductor materials Nuclear Inst. And Methods in Physics Research B6 (1985) 307–315.

Downey et al, Rapid thermal process requirements for the annealing of ultra–shallow junctions, Mat. Res. Soc. Symp Proc 470, 299–401.

Primary Examiner—John F. Niebling
Assistant Examiner—Walter L. Lindsay, Jr.
Attorney, Agent, or Firm—Rodney T Hodgson

[57] ABSTRACT

A method for rapid thermal processing (RTP) of a silicon substrate, the substrate having a surface with a plurality of areas implanted with dopant ions, comprising a) contacting the surface with a reactive gas, b) processing the substrate for a first process time and temperature sufficient to produce a significant protective layer upon the surface, and c) annealing the substrate for a second process time and temperature sufficient to activate the dopant material so that the sheet resistivity of the implanted areas is less than 500 ohms/square, where the first and second processing time and temperature are insufficient to move the implanted dopant ions to a depth of more than 80 nanometers from the surface.

14 Claims, 4 Drawing Sheets

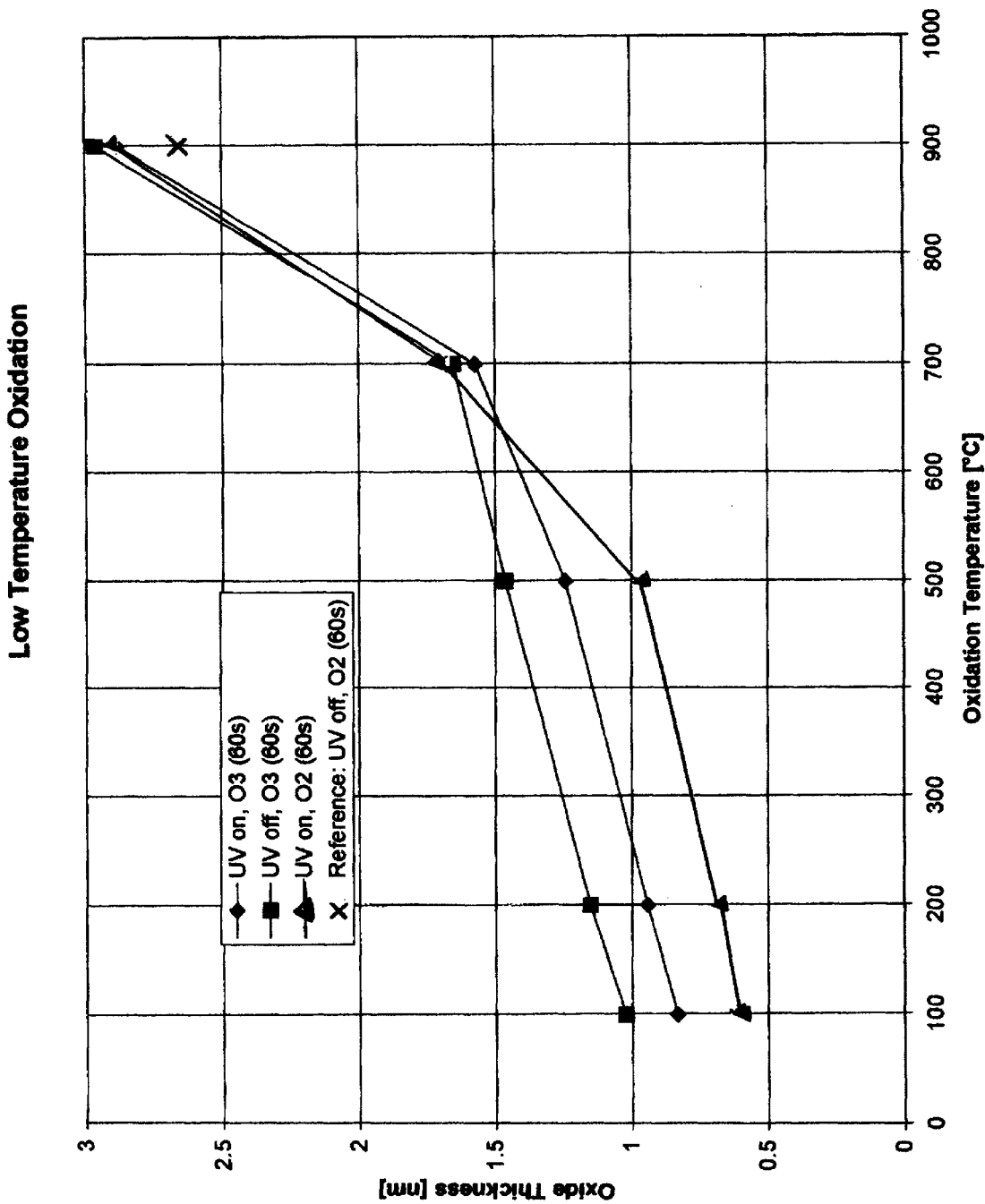

METHOD OF RAPID THERMAL PROCESSING (RTP) OF ION IMPLANTED SILICON

FIELD OF THE INVENTION

The present invention relates to a method for processing ion implanted silicon in a Rapid Thermal Processing (RTP) system to produce low resistivity p and n type regions with very shallow dopant distributions.

BACKGROUND OF THE INVENTION

The major problem faced by the field of RTP has been the uniformity of heating of the semiconductor wafers treated in the RTP systems. RTP systems generally have a chamber with at least one wall transparent to radiation from sources of radiation such as lamps. The object to be processed is placed in the chamber and irradiated with radiation from the radiation source so that the object is heated. The chamber with the transparent wall is not strictly necessary in the system, provided that the system controls the atmosphere in which the object is placed during processing. The lamps could then be placed in proximity to the object without the intervening window. Much progress has been made in using batteries of lamps with individual control of each lamp to increase uniformity of the illuminating radiation. However, the uniformity of the resulting material and the control of dopant diffusion has heretofore not been sufficient for future demands from the industry. In particular, prior art methods of processing silicon wafers implanted with dopant ions to activate the dopant ions result in the dopant ions being driven too deeply into the wafer. No prior art processes result in low resistivity, shallow doped areas across the wafer, uniform from run to run and batch to batch.

RELATED APPLICATIONS

Reactors based on the RTP principle often have the entire cross section of one end of the reactor chamber open during the wafer handling process. This construction has been established because the various wafer holders, guard rings, and gas distribution plates, which have significantly greater dimensions and may be thicker than the wafers, must also be introduced into the chamber and must be easily and quickly changed when the process is changed or when different wafer sizes, for example, are used. The reaction chamber dimensions are designed with these ancillary pieces in mind. U.S. Pat. No. 5,580,830, assigned to the assignee of the present invention, hereby incorporated by reference, teaches the importance of the gas flow and the use of an aperture in the door to regulate gas flow and control impurities in the process chamber.

The importance of measuring the temperature of the wafer using a pyrometer of very broad spectral response is taught in U.S. Pat. No. 5,628,564, which is assigned to the assignee of the present invention and is hereby incorporated by reference.

The wafer to be heated in a conventional RTP system typically rests on a plurality of quartz pins which hold the wafer accurately parallel to the reflector walls of the system. Prior art systems have rested the wafer on an instrumented susceptor, typically a uniform silicon wafer. Copending patent application Ser. No. 08/537,409, assigned to the assignee of the present invention, hereby incorporated by reference, teaches the importance succeptor plates separated from the wafer.

Rapid thermal processing of III–IV semiconductors has not been as successful as RTP of silicon. One reason for this is that the surface has a relatively high vapor pressure of, for example, arsenic (As) in the case of gallium arsenide (GaAs). The surface region becomes depleted of As, and the material quality suffers. Copending patent application Ser. No. 08/631,265, assigned to the assignee of the present invention, hereby incorporated by reference, supplies a method and apparatus for overcoming this problem.

A method of raising the emissivity of a lightly doped, relatively low temperature wafer by locally heating the wafer with a pulse of light is disclosed in copending application Ser. No. 08/632,364, which is assigned to the assignee of the present invention and hereby incorporated by reference.

A method, apparatus, and system for RTP of a rotating object is disclosed in copending application Ser. No. 08/953,590, filed Oct. 17, 1997, by Lerch et al., which is assigned to the assignee of the present invention, is hereby incorporated by reference.

A method of RTP of a substrate where a small amount of a reactive gas is used to control the etching of oxides or semiconductor is disclosed in copending application Ser. No. 08/886215, by Nenyei et al, filed Jul. 1, 1997, which is assigned to the assignee of the present invention is hereby incorporated by reference.

SUMMARY OF THE INVENTION

According to this invention, a method of activating shallow implanted dopant material in silicon is presented which does not result in the dopant being driven deep into the substrate or the dopant evaporating from the substrate as in prior art processes. The dopant ions are implanted into the bare surface of the wafer, and then a very thin protective layer is grown on the implanted surface at a temperature and time which is insufficient to drive the dopant ions deep into the wafer. The material may then be annealed at a time and temperature so that the dopant ions do not evaporate from the wafer surface and are not driven deeply into the wafer, and so that the resistivity of the implanted surface is low enough for device purposes.

BRIEF DESCRIPTION OF THE DRAWINGS

FIG. 3 shows a graph of measured oxide thickness as a function of temperature for a 60 sec RTP of a silicon wafer in oxygen and in ozone, with and without ultraviolet light impinging on the wafer.

DETAILED DESCRIPTION OF THE INVENTION

Figure 1A:
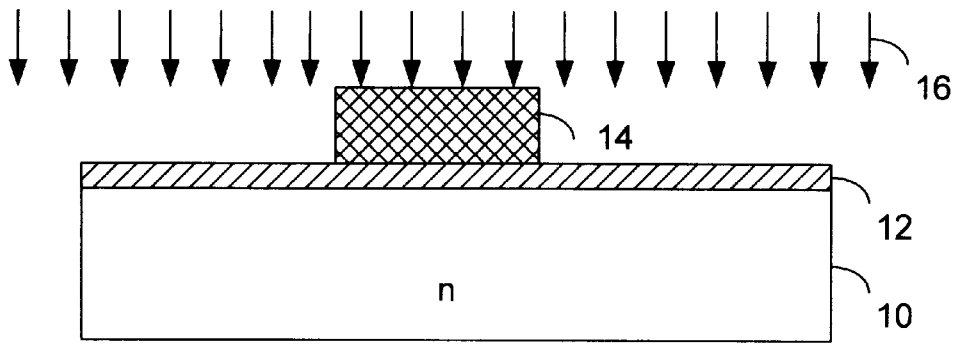
FIGS. 1a–d illustrates some steps of the prior art process.
Figure 1B:
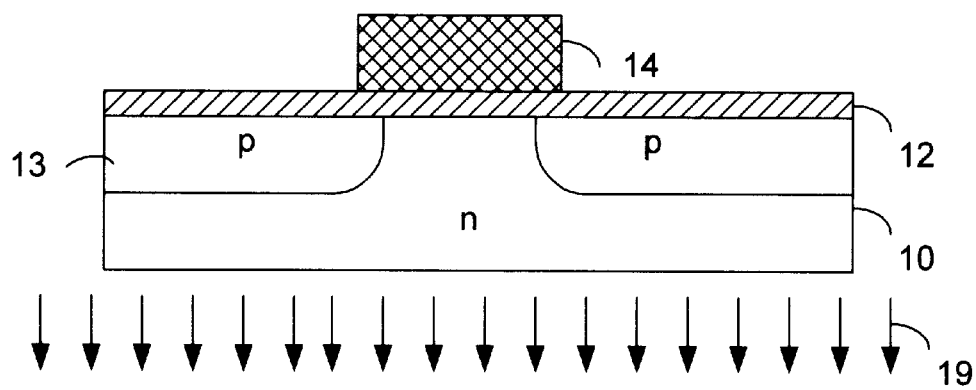
Figure 1C:
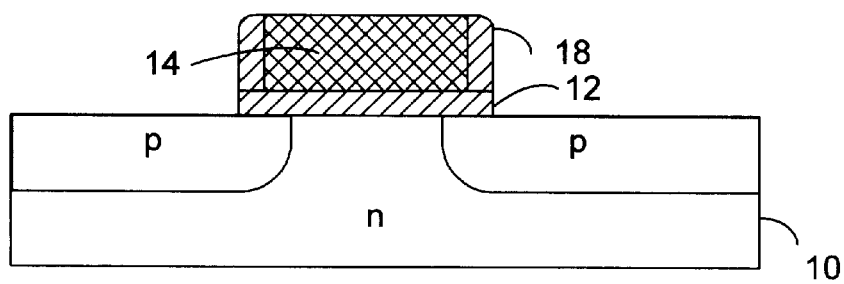
Figure 1D:
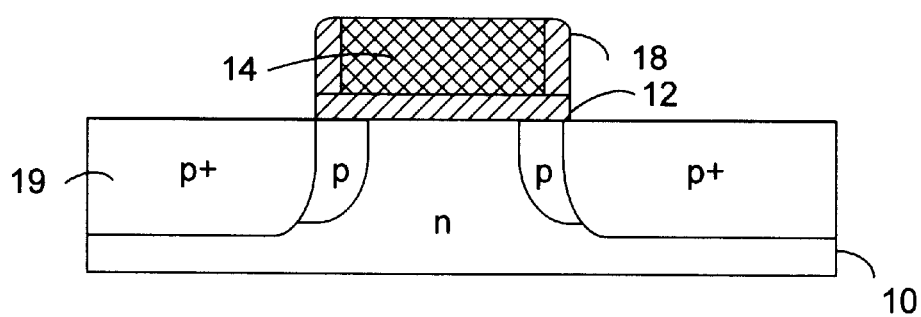

FIGS. 1a–1d illustrates some of the steps of the prior art process. FIG. 1a shows a wafer 10, noted here as having p type material on the surface, having a gate oxide layer 12 on the surface and a conducting gate material 14 formed on the surface of oxide 12. The wafer is being implanted by dopant ions 16, which are implanted through the gate oxide 12 to dope the source and drain extension regions or areas of wafer 10. The gate material 14 may be polysilicon or may be other material as known in the art. The gate material 14 stops the ions 16 from being implanted in the wafer material under the gate material 14. FIG. 1b shows the p type regions 13 formed from the implant of p type dopant ions 16. (Equivalently, the wafer surface could be p type, and n type dopant ions could be implanted.) However, when the implanted structure of FIG. 1a is annealed to give the structure of FIG. 1b, the oxygen ions from the oxide layer 12 "knocked on" by the implant ions 16 act to increase the rate of diffusion of the implanted dopant ions, and the p type regions 13 noted in FIG. 1b are too deep for future semiconductor devices. In addition, variations in the thickness of the oxide layer 12 lead to variations in the amount of dopant material which is left in the silicon substrate 10, and hence to variations in the resistivity of the doped regions. To continue the description of the prior art process, FIG. 1c shows the wafer cross section after a blanket oxidization and anisotropic etch of the oxide. Sidewalls of oxide 18 are left on the gate material 14. Dopant ions 19 are shown being implanted to form source and drain regions 15 of FIG. 1d. If the gate oxide material 12 is removed from outside the gate region before the ions 16 are implanted in the prior art process of FIG. 1a–d to avoid the problem of knock on oxygen ions, the dopant material implanted evaporates from the surface of the wafer in the annealing steps, and the amount of dopant left will be too variable to give good devices.

Figure 2A:
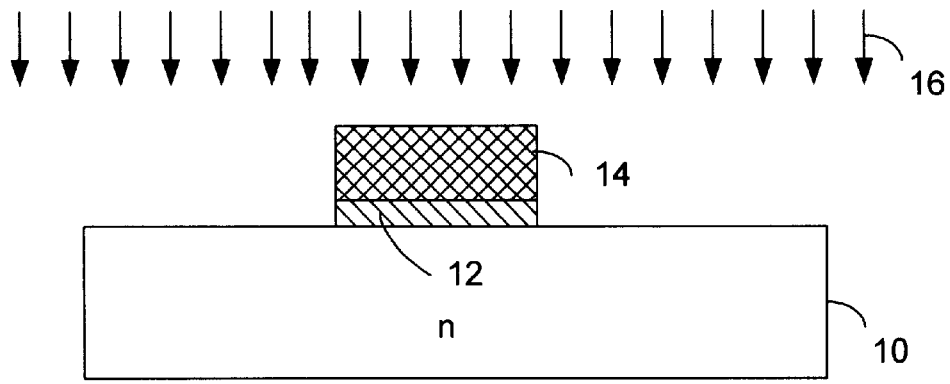
FIGS. 2a–d illustrates some steps of the process of the invention.
Figure 2B:
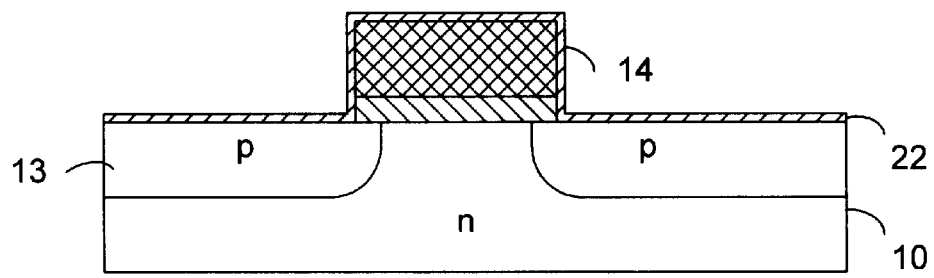

FIG. 2a–d illustrates some steps of the process of the invention. Briefly, the gate oxide layer 12 is removed from the wafer everywhere except under the gate material 14 before the dopant ions 16 are implanted as shown in FIG. 1a. A very thin protective layer 22 is then deposited or grown over the wafer surface as shown in FIG. 2b. The thin protective layer must be grown in a process where the time and temperature do not allow the dopant ions to move very far. Normal RTP oxidization processes for depositing or growing such a protective layer 22 are run at too high a time and temperature to avoid such dopant motion. The method of the invention uses an RTP procedure using a more reactive gas than molecular oxygen, or molecular oxygen with an extra energy source, to produce a protective layer. Examples of such reactive gases which provide a protective oxide layer are ozone, atomic oxygen, and molecular and atomic oxygen ions. Because the gases are more reactive than the normal oxygen, the time and temperature needed to form the protective layer 22 are less than required for forming the layer in normal oxygen. A preferred method of producing a protective oxide layer is to irradiate the wafer surface with ultraviolet light while performing an RTP process in a gas comprising molecular oxygen. The ultraviolet light may break apart oxygen molecules adsorbed on the surface to provide atomic oxygen, which is more reactive than molecular oxygen. Other preferred reactive gases comprise nitrogen containing gases. Detailed methods of producing such thin protective layers are given in: "Dielectric photoformation ofon Si and SiGe", by Ian W. Boyd, Chapter 9 p 235, in Advances in Rapid Thermal and Integrated Processes, Kluwer Academic Publishers, Netherlands, (1996); "Controlled thin oxidation and nitridation in a single wafer cluster tool", by I. LkSagnes et al, p253 of Mat. Res. Soc. Symp. Proc 387, Material Research Society, (1995); and "Integrated vapor phase cleaning and pure NO nitridation for gate stack formation", by F. Glowacki et al, MRS 1997 spring meeting. The above mentioned references are hereby incorporated by reference.

The thickness of the thin protective layer is preferably more than 0.1 nm thick, more preferably more than 0.5 nm thick, and most preferably more than 1 nm thick. If the layer too thick, too much of the implanted dopant will be consumed in the growth of the layer in an oxidative gas, and the uniformity of the sheet resistivity will suffer. The optimal thickness of the thin protective layer may be found by experimentation by one of ordinary skill in the art for the various conditions of implant dose, implant energy, and junction depth requirement.

Figure 2C:
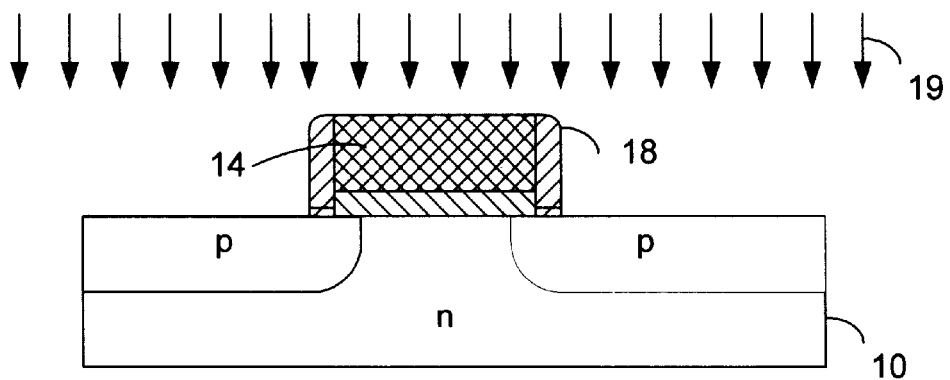
Figure 2D:
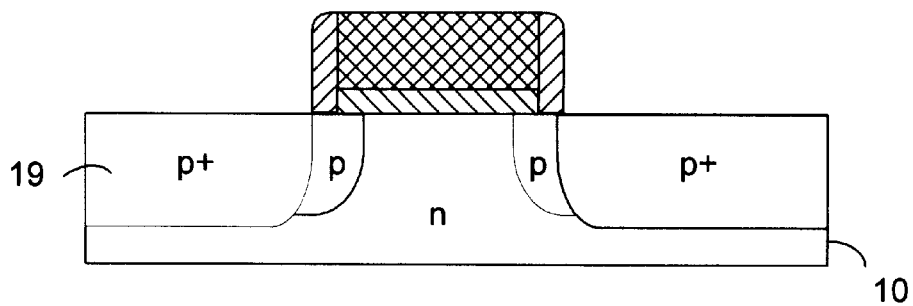

After the thin protective layer 22 is produced, the wafer is annealed at a time and temperature where the implanted dopant ions 16 are activated to give the required low resistivity, and where the dopant ions do not move further into the material than required by junction depth requirements, and where the dopant ions do not evaporate sufficiently to produce too great a variation in the resistivity over the wafer and from wafer to wafer and batch to batch. Once the implanted dopant ions are safely on lattice sites after the annealing process, they move relatively slowly in the later annealing processes needed to activate the source/drain implants. FIGS. 2c and 2d give the analogous processing steps as FIGS. 1c and 1d for implantation of the source and drain regions. After the source and drain regions have been implanted, the wafer is once again annealed to activate the source/drain implantations. In the case of the source/drain region, however, the loss of dopant from the surface, and the deeper drive-in of the dopant is not so critical to the operation of the device as the uniformity and depth of the source/drain extension areas.

Table 1 gives the requirements derived from work published by Semitech for guidelines for material needed in the future. Heretofore, such shallow implants could not be annealed to give sufficiently uniform results with the correct resistivity and depth.

TABLE 1

Future requirements for source/drain electrical junction depth, resistivity, and uniformity.

| year required | junction depth | p-type resistivity | n-type resistivity | 1 σ uniformity |
|---|---|---|---|---|
| 1999 | 80 nm | <400 Ω/square | <200 Ω/square | +/− 1% |
| 2001 | 60 nm | <400 Ω/square | <200 Ω/square | +/− 1% |
| 2006 | 40 nm | <500 Ω/square | <250 Ω/square | +/− 1% |

FIG. 3 shows a graph of measured oxide thickness as a function of temperature for a 60 sec RTP of a silicon wafer in oxygen and in ozone, with and without ultraviolet light impinging on the wafer.

Figure 4:
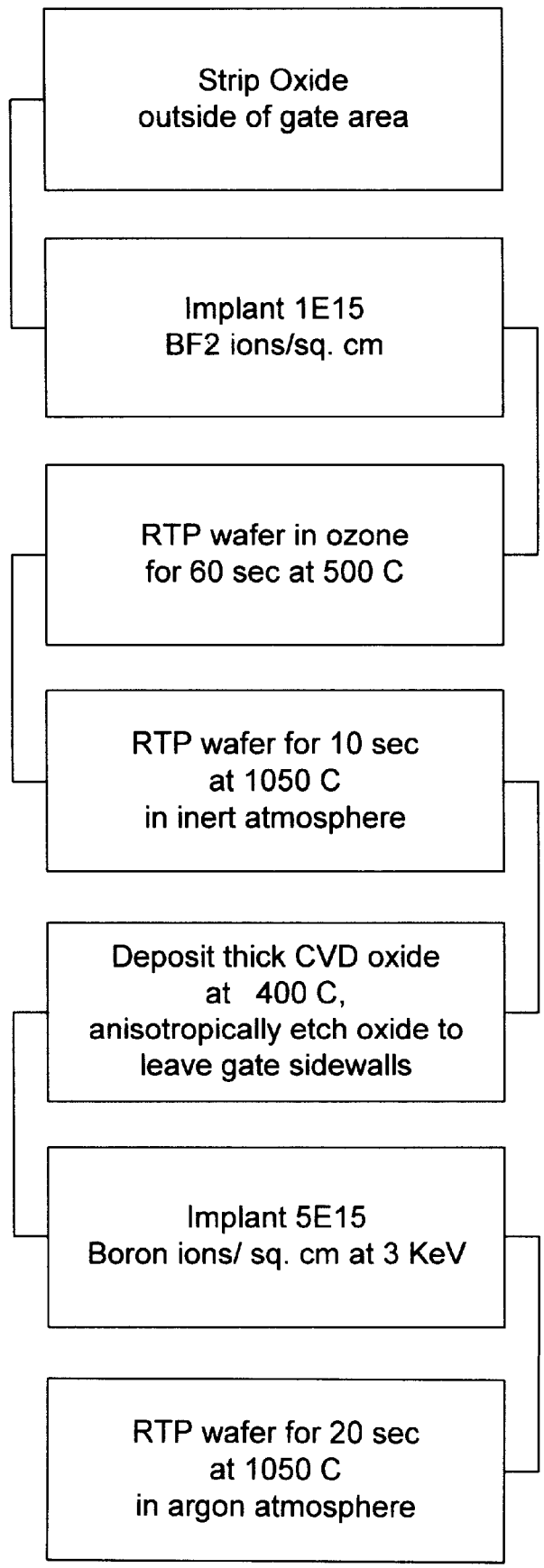
FIG. 4 shows a block diagram of the method of the invention detailing ion doses and RTP times and temperatures for a typical run.

FIG. 4 gives a block diagram of the steps of a preferred process of the invention. Strip oxide outside of gate area in step 40, and implant $10^{15}$ $BF_2$ ions/sq. cm. at 5 KeV in step 41. The energy of the $BF_2$ ions may also be 2.2 KeV or 1 KeV, and the dose of the $BF_2$ ions may be adjusted to give the required source/drain extension resistivity required. Step 42 requires a rapid thermal process of the wafer in ozone for 60 sec at 500° C. to provide a thin protective layer of oxide on the exposed silicon surface. The thin protective layer is preferably deposited at a temperature of less than 600° C. In some situations, a thin protective layer deposited at room temperature may be adequate. Alternatively, the thin protective layer may be produced by an RTP process in other reactive gases such as a plasma with molecular or atomic oxygen ions, or a flowing afterglow with free atomic oxygen atoms. Alternatively, the thin protective layer may be grown using molecular oxygen and ultraviolet light. Step 43 shows a rapid thermal annealing step of 10 seconds at 1050° C. to activate the source drain extension dopant, and to make sure that most dopant ions reside on lattice sites and are less mobile than the as implanted dopant ions. Step 44 shows the prior art deposition and anisotropic etch step for producing gate sidewalls, and steps 45 and 46 show the implantation and annealing steps for the source/drain.

The precise combination of RTP times and temperatures and implant doses and energies is very variable according to the process requirements, and is easily determined by one of ordinary skill in the RTP art. The inventors anticipate in particular that other methods of producing a thin protective layer will also be obvious to one skilled in the art.

We claim:

1. A method for rapid thermal processing (RTP) of a silicon substrate, the substrate having a surface with a plurality of areas implanted with unactivated dopant ions, comprising sequential steps of:

a) contacting the surface with a reactive gas;

b) processing the substrate for a first process time and temperature sufficient to produce a significant protective layer upon the surface; and c) annealing the substrate for a second process time and temperature sufficient to activate the dopant material so that the sheet resistivity of the implanted areas is less than 500 ohms/square, where the first and second processing time and temperature are insufficient to move the implanted dopant ions to a depth of more than 80 nanometers from the surface.

2. The method of claim 1, wherein the dopant ions are p-type dopant ions, and wherein the implanted dopant ions are moved in step c) to a depth of less than 40 nanometers, and wherein the sheet resistivity has a 1σ variation of less than 1%.

3. The method of claim 1, wherein the dopant ions are n-type dopant ions, and wherein the implanted dopant ions are moved in step c) to a depth of less than 40 nanometers, and wherein the sheet resistivity of the implanted areas is less than 250 ohms/square with a 1σ variation of less than 1%.

4. The method of claim 1, wherein the dopant ions are p-type dopant ions, and wherein the implanted dopant ions are moved in step c) to a depth of less than 60 nanometers, and wherein the sheet resistivity of the implanted areas is less than 400 ohms/square with a 1σ variation of less than 1%.

5. The method of claim 1, wherein the dopant ions are p-type dopant ions, wherein the sheet resistivity of the implanted areas is less than 400 ohms/square with a 1σ variation of less than 1%.

6. The method of claim 1, wherein the dopant ions are n-type dopant ions, wherein the sheet resistivity of the implanted areas is less than 200 ohms/square with a 1σ variation of less than 1%.

7. A method for rapid thermal processing (RTP) of a silicon substrate, the substrate having a surface with a plurality of areas implanted with unactivated dopant ions, comprising sequential steps of:

a) contacting the surface with an oxygen containing reactive gas;

b) processing the substrate for a first process time and temperature sufficient to produce a significant silicon dioxide layer upon the surface; and c) annealing the substrate for a second process time and temperature sufficient to activate the dopant material so that the sheet resistivity of the implanted areas is less than 500 ohms/square, where the first and second processing time and temperature are insufficient to move the implanted dopant ions to a depth of more than 80 nanometers from the surface.

8. The method of claim 7, wherein the oxygen containing reactive gas is chosen from the group consisting of ozone, atomic oxygen, atomic oxygen ions, molecular oxygen ions, and nitrogen pentoxide.

9. The method of claim 7, wherein the oxygen containing reactive gas is ozone.

10. The method of claim 8, wherein the dopant ions are p-type dopant ions, and wherein the implanted dopant ions are moved in step c) to a depth of less than 40 nanometers, and wherein the sheet resistivity has a 1σ variation of less than 1%.

11. The method of claim 8, wherein the dopant ions are n-type dopant ions, and wherein the implanted dopant ions are moved in step c) to a depth of less than 40 nanometers, and wherein the sheet resistivity of the implanted areas is less than 250 ohms/square with a 1 variation of less than 1%.

12. The method of claim 8, wherein the dopant ions are p-type dopant ions, and wherein the implanted dopant ions are moved in step c) to a depth of less than 60 nanometers, and wherein the sheet resistivity of the implanted areas is less than 400 ohms/square with a 1σ variation of less than 1%.

13. The method of claim 8, wherein the dopant ions are p-type dopant ions, wherein the sheet resistivity of the implanted areas is less than 400 ohms/square with a 1σ variation of less than 1%.

14. The method of claim 8, wherein the dopant ions are n-type dopant ions, wherein the sheet resistivity of the implanted areas is less than 200 ohms/square with a 1σ variation of less than 1%.

* * * * *